United States Patent
Huang et al.

(10) Patent No.: US 6,306,750 B1
(45) Date of Patent: Oct. 23, 2001

(54) BONDING PAD STRUCTURE TO PREVENT INTER-METAL DIELECTRIC CRACKING AND TO IMPROVE BONDABILITY

(75) Inventors: Yung-Sheng Huang, Hsin-chu; Chiu-Ching Lin, Tainan; Chun-Hung Lu, Win-Lin; Ruey-Lian Hwang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/483,934

(22) Filed: Jan. 18, 2000

(51) Int. Cl.⁷ .................................................. H01L 21/44
(52) U.S. Cl. ......................... 438/612; 438/597; 438/611; 438/613
(58) Field of Search ................................. 438/612, 597, 438/611, 613

(56) References Cited

U.S. PATENT DOCUMENTS 5,985,765 * 11/1999 Hsiao et al. .
6,043,144 * 3/2000 Kuo .

* cited by examiner

*Primary Examiner*—Kevin M. Picardat
*Assistant Examiner*—D. M. Collins
(74) *Attorney, Agent, or Firm*—George O. Saile; Stephen B. Ackerman

(57) ABSTRACT

A process of forming a bond pad structure, with a roughened top surface topography, used to improve the bondability of a gold wire bond, to the underlying bond pad structure, has been developed. The process features the use of a tungsten mesh pattern, formed in an IMD layer, and located underlying the bond pad structure, while overlying, and contacting, an underlying upper level, metal interconnect structure. The use of a tungsten mesh pattern, in place of individual tungsten studs, results in the creation of isolated islands, of IMED, reducing the bonding force, experienced by the IMD shapes, during the subsequent gold wire bond procedure. In addition the tungsten mesh pattern is formed via partial filling of a mesh pattern opening, in the IMD layer, resulting in an indented, or notched top surface. This in turn allows a roughened top surface, for the overlying bond pad structure, to be created, resulting in improved bondability of the gold wire, to the roughened top surface of the bond pad structure.

17 Claims, 4 Drawing Sheets

BONDING PAD STRUCTURE TO PREVENT INTER-METAL DIELECTRIC CRACKING AND TO IMPROVE BONDABILITY

BACKGROUND OF THE INVENTION

(1) Field of the Invention

The present invention relates to a method used to form a bonding pad, used to allow electrical communication between an overlying gold wire, and underlying circuitry of an integrated circuit, and more specifically to a method used to create a metal mesh pattern, underlying the bonding pad, used to increase the surface area, and the roughness of the overlying bonding pad.

(2) Description of the Prior Art

Wire bonds, physically, as well as electrically, connected to underlying circuitry, of semiconductor chips, are used to connect the specific semiconductor chip to packaging elements, such as printed circuit board, or ceramic modules. A bond pad structure, is usually formed overlying the top conductive layer, of the semiconductor chip, and used to accept an overlying metal, or gold wire bond structure. In most cases a group of metal studs are used between, and to connect the bond pad structure, to the top conductive layer, of a semiconductor chip, with the metal studs formed in via holes, that in turn have been formed in an inter-metal dielectric, (IMD), layer. However the large, exposed, surface area of IMD layer, located surrounding the smaller regions of metal studs, can result in defect formation, or cracking of the IMD layer, as a result of the large bonding force, experienced during the metal wire bonding procedure, where the large bonding forces is distributed throughout the overlying bond pad structure.

This invention will describe a process for fabricating a metal mesh pattern, to be used in place of a group of individual studs. The presence of the metal mesh pattern, creates isolated islands of IMD, reducing the area of the exposed IMD, thus reducing the bonding force on the IMD) shape. In addition the metal mesh pattern is formed with indented, or notched, top surface features, which increases the surface area of the metal mesh structures, when compared to metal mesh patterns, comprised with smooth top surface topographies. This in turn result in a roughened top surface of the overlying, bond pad structure, allowing improved bondability characteristics, for the subsequent metal, or gold wire bonds, to be realized. Prior art, such Shiue et at, in U.S. Pat. No. 5,700,735, describe the formation of, and the use of, diamond shaped via plug structures, to improve the characteristics of an overlying bond pad structure. However that prior art does not describe the metal mesh pattern, with indented, or notched top surfaces, used to allow an overlying, bond pad structure, with increased top surface roughness, to be achieved.

SUMMARY OF THE INVENTION

It is an object of this invention to form a metal wire bond, to an underlying bond pad structure, which in turn communicates with underlying circuitry, of a semiconductor chip.

It is another object of this invention to use a metal mesh pattern, formed in an IMD layer, located between the overlying bond pad structure, and the underlying circuitry of the semiconductor chip, and used to reduce the exposed surface area of the IMD layer, when compared to counterparts fabricated using a group of metal via plugs, thus reducing the bonding force distributed on the IMD layer, during the metal wire bond procedure.

It is yet another object of this invention to form the metal mesh pattern with an indented, or notched, top surface topography, to increase the surface roughness of the overlying bond pad structure, thus improving adhesion of the metal wire bond, to the underlying bond pad structure.

In accordance with the present invention a method of forming a metal mash pattern, in an IMD layer, located between an overlying, bond pad structure, and the underlying circuitry of a semiconductor chip, wherein the top surface of the metal mesh pattern is indented, or notched, is described. An IMD layer is formed on an upper level metal interconnect pattern, of a semiconductor chip, followed by the opening of a mesh, or grid pattern, in the IMD layer, exposing regions of the top surface of the upper level metal interconnect pattern. A metal layer, such as tungsten is deposited, not completely filling the mesh or grid pattern, in the IMD layer, resulting in an indented, or notched, top surface, for regions of the metal layer, located in the mesh openings. Removal of regions of the metal layer, from the top surface of the IMD layer, via a chemical mechanical polishing, (CMP), procedure, or via a reactive ion etch back procedure, results in a metal, or tungsten, mesh pattern, in the IMD layer, overlying and contacting the regions of the upper level metal interconnect pattern, exposed in the mesh pattern opening, with the metal mesh pattern featuring an indented, or notched, top surface topography. Deposition and patterning, of a metal layer, such as an aluminum—copper layer, is next addressed, resulting in a bond pad structure, with a roughened top surface topography, overlying, and contacting, the metal mesh pattern. A metal, or gold wire bond, is then made to the roughened top surface, of the bond pad structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1A:
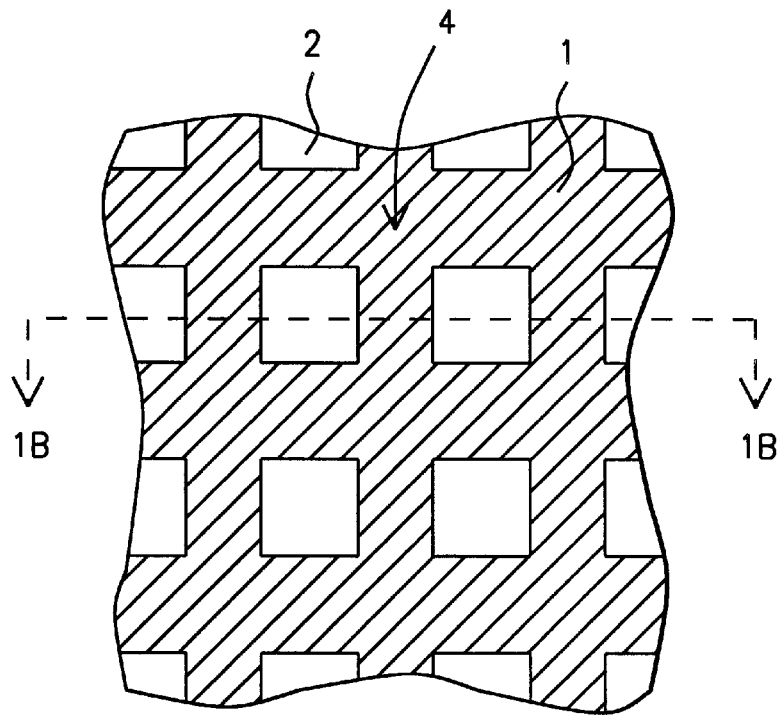
FIGS. 1A and 3A, which schematically show the top view of the metal mesh pattern, again at key stages of fabrication.
Figure 1B:
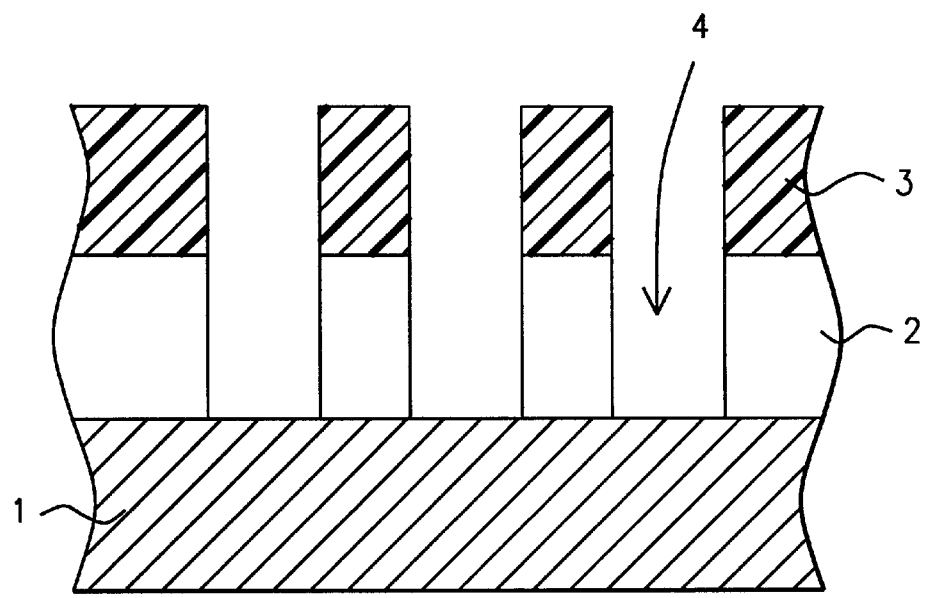
FIGS. 1B, 2, 3B, 4, and 5, which schematically, in cross-sectional style, describe key stages of fabrication used to create a metal mesh pattern, with an indented, or notched top surface topography, located underlying a bond pad structure, and overlying, and contacting, an upper level metal interconnect pattern, of a semiconductor chip.

The method of forming a metal mesh structure, used to physically, and electrically connect, an overlying bond pad structure, to underlying, upper level metal interconnect structures, of a semiconductor chip, and featuring a notched, or indented, top surface topography, for the metal mash structure, allowing a rough top surface topography, for the overlying bond pad structure, to be realized, will now be described in detail. FIG. 1B, schematically shows an upper level, metal interconnect structure 1, comprised of a material such as aluminum—copper, copper, or tungsten. An inter-metal dielectric, (IMD), layer 2, comprised of either silicon oxide, or borophosphosilicate glass, is formed on upper level, metal interconnect structure 1, via low pressure chemical vapor deposition, (LPCVD), or plasma enhanced chemical vapor deposition, (PECVD), procedures, to a thickness between about 5000 to 15000 Angstroms. If desired IMD layer 2, can be a low dielectric constant layer, such as a fluorinated silica glass layer, with a dielectric constant between about 3.0 to 3.5, or If layer 2, can be a low dielectric, organic layer, such as poly(arylene) ether, with a dielectric constant between about 2.6 to 2.8. A photoresist shape 3, is next formed on IMD layer 2, to be used as an etch mask, allowing opening 4, to be created in IMD layer 2, via an anisotropic reactive ion etching, (RIE), procedure, using $CHF_3$ as an etchant for the silicon oxide or borophosphosilicate glass options, of IMD layer 2. This is schematically shown, in cross-sectional style in FIG. 1B, and for a top view in FIG. 1A. Opening 4, as shown for the top view, in FIG. 1A, exposing regions of upper level, metal interconnect structure 1, results in mesh pattern opening 4, in IMD layer 2, which when filled with subsequent metal, allows the desired metal mesh pattern, to be obtained. The dimensions, intems of the top surface, of isolated islands of IMD layer 2, shown schematically in FIG. 1A, are about 2.0 by 2.0 um, while the space between the isolated islands of IMD layer 2, or the width of opening 4, to be subsequently filed with the metal mesh pattern, is between about 0.3 to 1.5 um.

Figure 2:
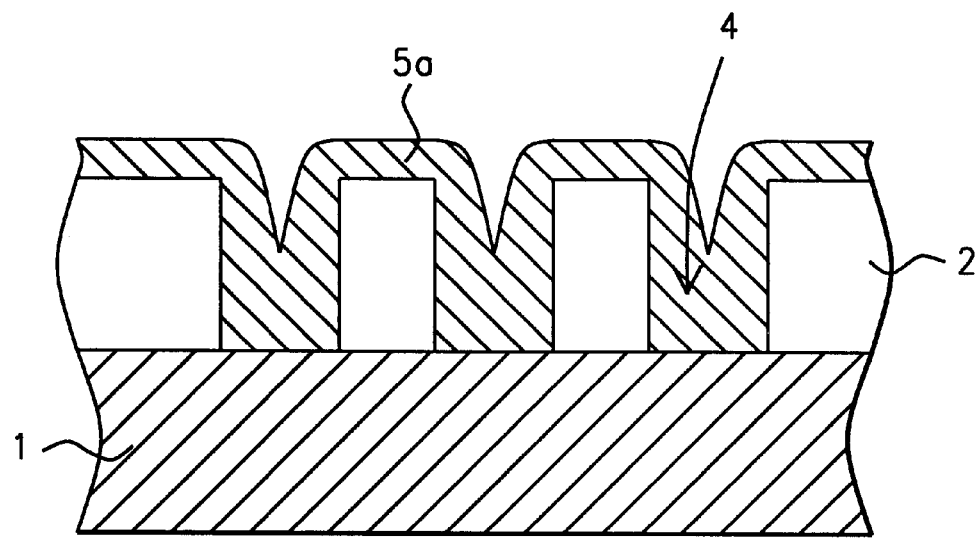

After removal of photoresist shape 3, via plasma oxygen ashing and careful wet cleans, metal layer 5a, is deposited, partially filling mesh opening 4, in IMD layer 2. Metal layer 5a, can be a tungsten layer, obtained via LPCVD procedures, at a temperature between about 300 to 500° C., to a thickness between about 3000 to 10000 Angstroms, using tungsten hexafluoride as a source. The deposition of metal layer 5a, is intentionally terminated prior to the complete filling of mesh pattern opening 4. This allows a notched, or indented, top surface of metal layer 5a, to be created in regions in which metal layer 5a, resided in mesh opening 4. This is schematically shown in FIG. 2.

Figure 3A:
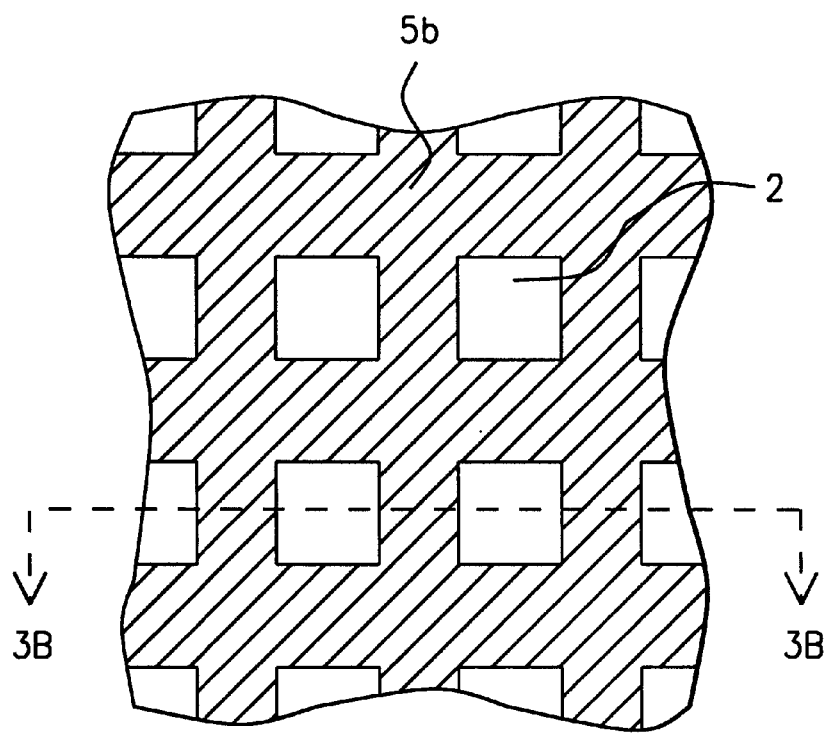
Figure 3B:
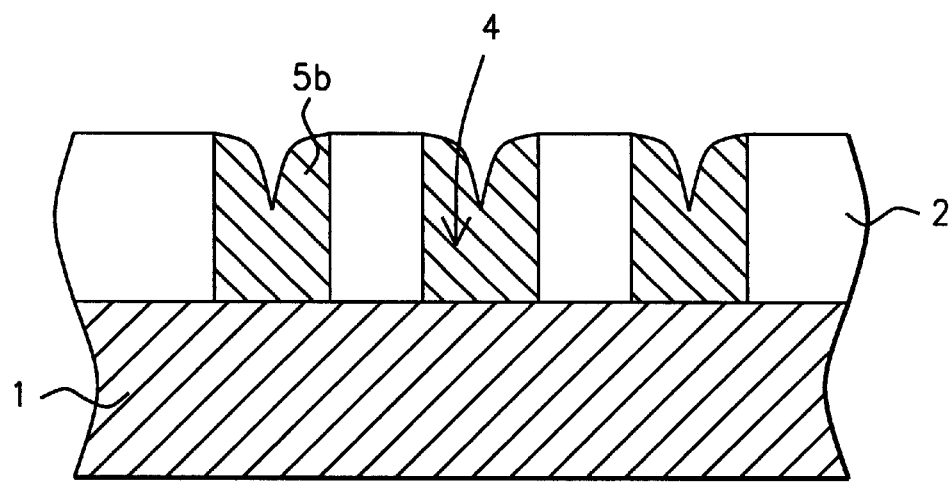

A chemical mechanical polishing, (CMP), procedure, is next employed to remove regions of metal layer 5a, from the top surface of the isolated islands of IMD layer 2, resulting in the metal mesh pattern, or structure 5b, residing in mesh pattern opening 4. This is schematically shown in cross-sectional style, in FIG. 3B, and schematically shown as a top view, in FIG. 3A. The CMP procedure does not disturb the regions of metal mesh pattern 5b, residing in mesh opening 4, thus leaving the desired notched, or indented to surface, of metal mesh pattern 5b, unchanged. If desired, a selective, anisotropic RIE procedure, using $Cl_2$ of $SF_6$ as an etchant for the metal., or tungsten, of metal mesh pattern 5b, can be used to remove regions of metal from the top surface of the isolated islands of IMD layer 2. The RIE procedure would also remove the top region of metal mesh pattern 5b, residing in mesh pattern opening 4, however the notched, or indented feature, of metal mesh pattern 5b, would, although depressed in opening 4, still retain the desired notched, or indented feature.

Figure 4:
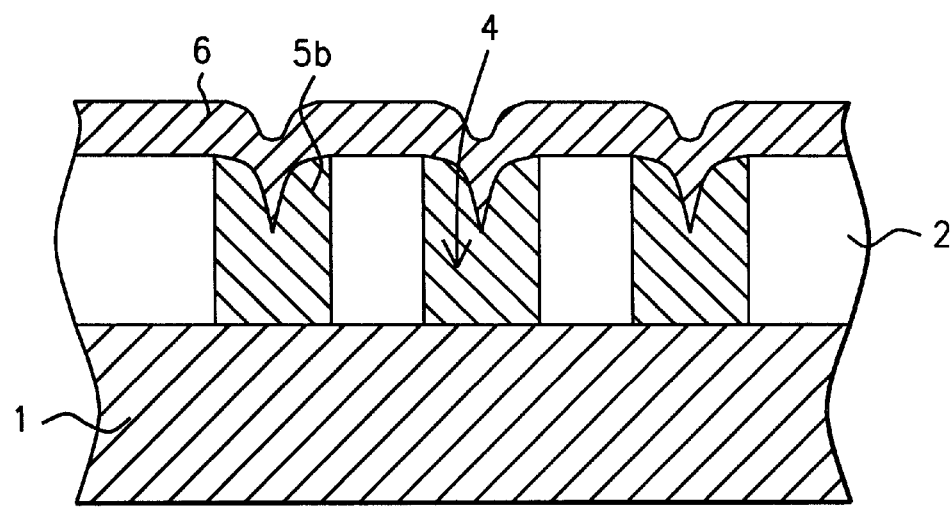

FIG. 4, schematically shows the creation of bond pad structure 6. This is accomplished via deposition of an aluminum—copper layer, via plasma vapor deposition procedures, to a thickness between about 3000 to 12000 Angstroms. The weight % of copper, in the aluminum—copper, bonding pad structure, is between about 0 to 3%. The notched, or indented features of underlying, metal mesh pattern 5b, are transferred to bonding pad structure 6, as seen by the rough top surface topography of bonding pad structure 6. Conventional photoresist and RIE procedures, using $Cl_2$ as an etchant, are employed to define the desired shape for bonding pad structure 6. Plasma oxygen ashing and careful wet cleans are used to remove the photoresist shape, used for definition of bonding pad structure 6.

Figure 5:
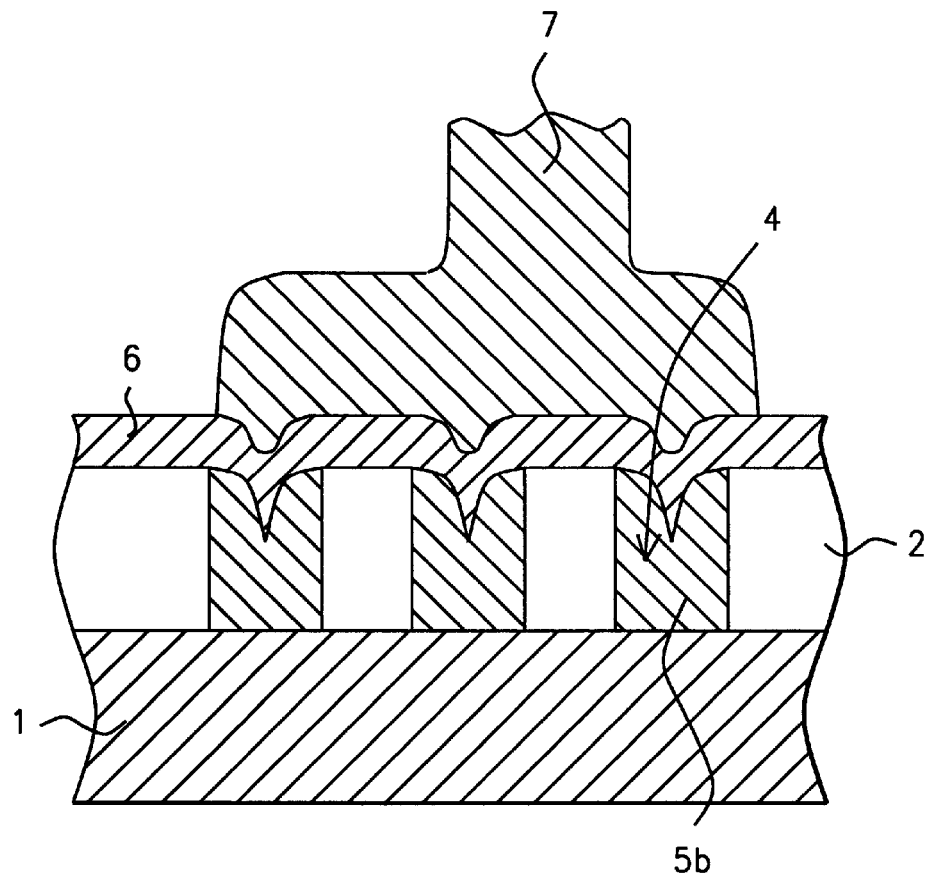

The desired roughened surface of bond pad structure 6, results in improved bond characteristics, in terms of decreased physical damage, as well as reduced bonding force, and reduced ball or wire, sheer resistance, when a wire, such as gold, is bonded to bond pad structure 6. FIG. 5, schematically shows gold wire 7, bonded to underlying bond pad structure 6. The reduced size, or reduced surface area of the isolated islands of IMD layer 2, present with mesh pattern opening 4, allows a reduced bonding force to occur, during the gold wire bond procedure, when compared to a larger distributed bonding force, which occurs with when larger areas of IMD layer, present when individual metal plug structures are used in place of metal mesh pattern 5b, are subjected to the gold wire bond procedure.

While this invention has been particularly shown and described with reference to the preferred embodiments thereof, it will be understood by those skilled in the art, that various changes in form and detail may be made without departing from the spirit and scope of this invention.

What is claimed is:

1. A method of creating a bond pad structure, on a semiconductor substrate, comprising the steps of:

providing an upper level, metal interconnect structure, overlying, and contacting, underlying conductive regions, on, or in, said semiconductor substrate;

forming an inter-metal dielectric, (IMD), layer, on said upper level, metal interconnect structure;

performing an etching procedure to create a mesh pattern opening, in said IMD layer, exposing regions of the top surface of said upper level, metal interconnect structure, and creating unetched, isolated islands of said IMD layer, depositing a metal layer, on the top surface of said isolated islands of said IMD layer, and partially filling said mesh pattern opening;

removing portions of said metal layer from the top surface of said isolated islands of said IMD layer, creating a metal mesh structure, in said mesh pattern opening, with the metal mash structure featuring a notched, or indented top surface, resulting from the partial metal fill of said mesh pattern opening;

forming said bond pad structure, featuring a roughened top surface topography, as a result of the underlying notched, or indented surface, of said metal mesh structure; and forming a wire bond on said bond pad structure.

2. The method of claim 1, wherein said upper level, metal interconnect structure is formed from a metal chosen from a group that includes; aluminum—copper, copper, or tungsten.

3. The method of claim 1, wherein said IMD layer is either a silicon oxide layer, or a borophosphosilicate glass layer, obtained via LPCVD or PECVD procedures, at a thickness between about 5000 to 15000 Angstroms.

4. The method of claim 1, wherein said mesh opening pattern is formed in said IMD layer via an anisotropic RIE procedure, using $CHF_3$ as an etchant.

5. The method of claim 1, wherein the width of said mesh pattern opening, or the space between said isolated islands of said IMD layer, is between about 0.3 to 1.5 um, while the dimensions of the top surface of said isolated islands of said IMD layer is 2.0 by 2.0 um.

6. The method of claim 1, wherein said metal layer is tungsten, obtained via LPCVD procedures, at a temperature between about 300 to 500° C., to a thickness between about 3000 to 10000 Angstroms, using tungsten hexafluoride as a source.

7. The method of claim 1, wherein a chemical mechanical polishing procedure is used to form said metal mesh structure, in said mesh opening pattern.

8. The method of claim 1, wherein said bond pad structure, is formed from an aluminum—copper layer, obtained via plasma vapor deposition procedures, at thickness between about 3000 to 12000 Angstroms, with a weight % of copper, between about 0 to 3%.

9. The method of claim 1, wherein said wire bond is a gold wire bond.

10. A method of forming a bond pad structure, on a tungsten mesh pattern, on a semiconductor substrate, with said tungsten mesh pattern comprised with an indented top surface topography, comprising the steps of providing an upper level, metal interconnect structure, overlying, and contacting, conductive regions, on, or in, said semiconductor substrate, forming an inter-metal dielectric, (IMD), layer, on said upper level, metal interconnect structure;

performing an anisotropic reactive ion etching procedure to pattern said IMD layer, creating an mesh pattern opening in said IMD layer, and creating isolated islands of said IMD layer, with regions of said upper level, metal interconnect structure, exposed in said mesh pattern opening;

depositing a tungsten layer, on the top surface isolated islands of said IMD layer, and partially filling said mesh pattern opening, resulting in said indented top surface topography for the portion of said tungsten layer residing in mesh pattern opening;

performing a chemical mechanical polishing procedure, to remove regions of said tungsten layer, from the top surface of said isolated islands of said IMD layer, and forming said tungsten mesh pattern, in said mesh pattern opening, with said tungsten mesh pattern featuring said indented top surface topography;

forming an aluminum-copper bond pad structure, with a roughened top surface topography, on said tungsten mesh pattern; and forming a gold wire bond, on said aluminum-copper bond pad structure.

11. The method of claim 10, wherein said upper level, metal interconnect structure is comprised of a metal, chosen from a group that includes, aluminum—copper, copper, or tungsten.

12. The method of claim 10, wherein said IMD layer is either a silicon oxide, or a borophosphosilicate glass layer, obtained via LPCVD or PECVD procedures, at a thickness between about 5000 to 15000 Angstroms.

13. The method of claim 10, wherein said mesh opening in said IMD layer, and said isolated islands of said IMD layer, are formed via the anisotropic RIE procedure, using $CHF_3$ as an etchant.

14. The method of claim 10, wherein the width of the opening, in said mesh pattern opening, or the space between said isolated islands of said IMD layer, is between about 0.3 to 1.5 um.

15. The method of claim 10, wherein the top surface dimension of said isolated islands of said IMD layer is between about 2.0 by 2.0 um.

16. The method of claim 10, wherein said tungsten layer, at a thickness between about 3000 to 10000 Angstroms, is obtained via LPCVD procedures, at a temperature between about 300 to 500° C., using tungsten hexafluoride as a source.

17. The method of claim 10, wherein said aluminum—copper bond pad structure, is formed from an aluminum—copper layer, obtained via plasma vapor deposition procedures, at a thickness between about 3000 to 12000 Angstroms, comprised with a copper content, between about 0 to 3 weight percent.

* * * * *